(12) United States Patent
Saito

(10) Patent No.: US 8,779,488 B2
(45) Date of Patent: Jul. 15, 2014

(54) SEMICONDUCTOR MEMORY DEVICE

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/443,027

(22) Filed: Apr. 10, 2012

(65) Prior Publication Data
US 2012/0261734 A1 Oct. 18, 2012

(30) Foreign Application Priority Data
Apr. 15, 2011 (JP) ................................. 2011-091530

(51) Int. Cl.
*H01L 27/108* (2006.01)

(52) U.S. Cl.
USPC ......... 257/296; 257/67; 257/71; 257/E27.084

(58) Field of Classification Search
USPC ............................. 257/296, E27.084, 67, 71
See application file for complete search history.

(56) References Cited

U.S. PATENT DOCUMENTS

| | | | |
|---|---|---|---|
| 4,466,081 A | 8/1984 | Masuoka | |
| 4,947,229 A | 8/1990 | Tanaka et al. | |
| 5,339,181 A | 8/1994 | Kim et al. | |
| 5,446,410 A | 8/1995 | Nakakura | |
| 5,528,032 A | 6/1996 | Uchiyama | |
| 5,731,856 A | 3/1998 | Kim et al. | |
| 5,744,864 A | 4/1998 | Cillessen et al. | |
| RE36,278 E | 8/1999 | Nakakura | |
| 6,190,942 B1 | 2/2001 | Wilm et al. | |
| 6,294,274 B1 | 9/2001 | Kawazoe et al. | |
| 6,326,693 B1 | 12/2001 | Mimoto et al. | |
| 6,341,087 B1 | 1/2002 | Kunikiyo | |
| 6,346,717 B1 | 2/2002 | Kawata | |
| 6,384,727 B1 | 5/2002 | Diprizio et al. | |

(Continued)

FOREIGN PATENT DOCUMENTS

EP 1 737 044 A1 12/2006
EP 2 226 847 A2 9/2010

(Continued)

OTHER PUBLICATIONS

S.S. Kim et al.; "4:3: High-Aperture and Fault-Tolerant Pixel Structure for TFT-LCDs"; SID Digest '95 : SID International Symposium Digest of Technical Papers; 1995; pp. 15-18; vol. 26.

(Continued)

*Primary Examiner* — Long Pham
(74) *Attorney, Agent, or Firm* — Fish & Richardson P.C.

(57) ABSTRACT

In the semiconductor memory device, one of a source and a drain of a first transistor is connected to one of a source and a drain of a second transistor, a gate of the first transistor is connected to one of a source and a drain of a third transistor and one of a pair of capacitor electrodes included in a capacitor, the other of the source and the drain of the first transistor and the other of the source and the drain of the third transistor are connected to a bit line, the other of the pair of capacitor electrodes included in the capacitor is connected to a common wiring, and the common wiring is grounded (GND). The common wiring has a net shape when seen from the above, and the third transistor is provided in a mesh formed by the common wiring.

21 Claims, 7 Drawing Sheets

(56) References Cited

U.S. PATENT DOCUMENTS

| | | | |
|---|---|---|---|
| 6,563,174 B2 | 5/2003 | Kawasaki et al. |
| 6,724,149 B2 | 4/2004 | Komiya et al. |
| 6,727,522 B1 | 4/2004 | Kawasaki et al. |
| 6,828,584 B2 | 12/2004 | Arao et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,408,196 B2 | 8/2008 | Kurokawa |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,058,672 B2 | 11/2011 | Kurokawa |
| 2001/0046027 A1 | 11/2001 | Tai et al. |
| 2002/0056838 A1 | 5/2002 | Ogawa |
| 2002/0126108 A1 | 9/2002 | Koyama et al. |
| 2002/0132454 A1 | 9/2002 | Ohtsu et al. |
| 2003/0117347 A1 | 6/2003 | Hunter et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0150351 A1 | 8/2004 | Komiya et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1* | 10/2006 | Kimura ................... 315/169.3 |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0032181 A1 | 2/2012 | Kurokawa |
| 2012/0261664 A1 | 10/2012 | Saito |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-021712 A | 1/1993 |
| JP | 05-145036 A | 6/1993 |
| JP | 05-251705 A | 9/1993 |
| JP | 06-275697 A | 9/1994 |
| JP | 08-264794 A | 10/1996 |
| JP | 10-107152 A | 4/1998 |
| JP | 11-505377 A | 5/1999 |
| JP | 2000-044236 A | 2/2000 |
| JP | 2000-150900 A | 5/2000 |
| JP | 2002-033456 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-347510 A | 12/2003 |
| JP | 2004-047541 A | 2/2004 |
| JP | 2004-103821 A | 4/2004 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature dependence of characteristics and electronics structure for amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphoreecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of blue phases on chiral networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crys-

(56) References Cited

OTHER PUBLICATIONS talline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energentics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014

Ohara, H et al., "21.3: 4.0 IN. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistors on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR MEMORY DEVICE

BACKGROUND OF THE INVENTION

1. Field of the Invention

The present invention relates to a semiconductor memory device which includes a circuit including a semiconductor element such as a transistor.

2. Description of the Related Art

Semiconductor memory devices are broadly classified into two categories: a volatile device that loses stored data when power supply stops, and a non-volatile device that retains stored data even when power is not supplied.

A typical example of a volatile semiconductor memory device is a dynamic random access memory (DRAM). A DRAM stores data in such a manner that a transistor included in the semiconductor memory device is selected and charge is stored in a capacitor connected to the transistor.

In a DRAM, since charge of a capacitor is lost instantaneously after information is read out, rewriting needs to be performed every time information is read out. In addition, when a transistor included in the DRAM is off, charge is lost due to leakage current (off-state current) between a source and a drain and the like; therefore, a data retention time is short. Accordingly, a writing operation (a refresh operation) is needed in a predetermined cycle, which results in increase in power consumption. In addition, data is lost when supply of power is stopped, and thus another memory device using, for example, a magnetic material or an optical material is needed in order to retain data for a long time.

Another example of a volatile semiconductor memory device is a static random access memory (SRAM). An SRAM retains stored data by using a circuit such as a flip-flop and thus does not need refresh operation. This means that an SRAM has an advantage over a DRAM. However, there is a problem in that cost per storage capacity becomes high because a circuit such as a flip flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by retaining charge in the floating gate. Therefore, a flash memory has advantages in that the data retention time is extremely long and refresh operation which is necessary in a volatile memory device is not needed (e.g., see Patent Document 1).

However, a gate insulating layer included in the semiconductor memory device deteriorates by tunneling current generated in writing, so that the semiconductor memory device stops its function after a predetermined number of writing operations. In order to reduce adverse effects of this problem, a method in which the number of writing operations for the semiconductor memory devices is equalized is employed, for example. However, a complicated peripheral circuit is needed to achieve this method. Moreover, employing such a method does not solve the fundamental problem of lifetime. In other words, a flash memory is not suitable for a semiconductor memory device in which data is frequently rewritten.

In addition, high voltage is necessary to retain charge in the floating gate or remove the charge, and a circuit for generating high voltage is also necessary. Further, it takes a relatively long time to retain or remove charge, so that it is not easy to increase the speed of write and erase operations.

REFERENCE

Patent Document

[Patent Document 1] Japanese Published Patent Application No. S57-105889.

SUMMARY OF THE INVENTION

An object of one embodiment of the present invention is to provide a semiconductor memory device with a novel structure which can retain data even when power is not supplied, and which has no limitation on the number of write operations.

An object of one embodiment of the present invention is to increase the integration degree of the semiconductor memory device with a novel structure and to increase storage capacity per unit area.

An object of one embodiment of the present invention is to prevent electrostatic breakdown of every memory cell included in a semiconductor memory device and to improve the yield of the semiconductor memory device.

A semiconductor memory device that is one embodiment of the present invention includes a bit line, a word line, a source line, a common wiring, a first transistor, a second transistor, a third transistor including an oxide semiconductor, and a capacitor. One of a source and a drain of the first transistor is connected to one of a source and a drain of the second transistor, a gate of the first transistor is connected to one of a source and a drain of the third transistor and one of a pair of capacitor electrodes included in the capacitor, the other of the source and the drain of the first transistor and the other of the source and the drain of the third transistor are connected to the bit line, a gate of the third transistor is connected to the word line, a gate of the second transistor and the other of the source and the drain of the second transistor are connected to the source line, the other of the pair of capacitor electrodes included in the capacitor is connected to the common wiring, and the common wiring is grounded (GND). The common wiring has a net shape when seen from the above, and the third transistor is provided in a mesh formed by the common wiring.

"Netlike" refers to a shape in which conductive films and the like are vertically and horizontally crossed. In addition, the "mesh" refers to an interstice in the shape in which the conductive films are vertically and horizontally crossed.

In the semiconductor memory device formed in such a manner, the capacitor is charged using the third transistor, and the on/off of the first transistor is controlled in accordance with the charge. Data obtained when the first transistor is on is referred to as Data 1; data obtained when the first transistor is off is referred to as Data 0. Although described later, the third transistor has extremely small off-state current, and thus the charge accumulated in the capacitor can be retained for a long time.

The third transistor includes a pair of electrodes; an oxide semiconductor film in contact with at least top surfaces of the pair of electrodes; a first insulating film provided over the oxide semiconductor film; a gate electrode overlapping with the oxide semiconductor film with the first insulating film provided therebetween; and a second insulating film provided to cover the pair of electrodes, the oxide semiconductor film, the first insulating film, and the gate electrode.

One of the pair of electrodes of the third transistor and the common wiring serve as a pair of capacitor electrodes of the capacitor, and at least the second insulating film serves as a dielectric film of the capacitor. Therefore, the capacitor is provided along a side surface of the one of the pair of electrode of the third transistor. Accordingly, the surface area of the capacitor can be increased by adjusting the thickness of the pair of electrodes, so that the capacitance per unit area seen from the above can be increased. Note that the common wiring is also referred to as a netlike conductive film.

Note that the "pair of capacitor electrodes" refers to a pair of electrodes which form the capacitance of the capacitor. In addition, the "dielectric film" refers to a film which is positioned between the pair of capacitor electrodes of the capacitor, and is polarized when voltage is applied between the pair of capacitor electrodes.

Note that the common wiring is provided to have a net shape covering the third transistor, and thus has not only a function as the other of the capacitor electrodes but also a function as a guard ring. Since the common wiring functions as a guard ring to prevent the electrostatic breakdown of every memory cell, so that a highly reliable semiconductor memory device can be obtained with a high yield.

The pair of electrodes functions as a source electrode and a drain electrode of the third transistor. Further, the first insulating film functions as a gate insulating film of the third transistor.

In addition, a third insulating film which fills a space between the pair of electrodes may be provided. "The third insulating film filling a space between the pair of electrodes is provided" can also be referred to as "the third insulating film is provided in a region which is sandwiched between the pair of electrodes". When the third insulating film is provided, since the oxide semiconductor film and the first insulating film do not need to be provided so as to be beyond steps formed by the pair of electrodes, coverage with the oxide semiconductor film and the first insulating film is improved, so that leakage current generated between the gate electrode and the pair of electrodes can be reduced. However, when the third insulating film is not provided, leakage current is not necessarily generated between the gate electrode and the pair of electrodes. The coverage with the oxide semiconductor film and the first insulating film depends on their deposition methods and the shape of the pair of electrodes. For example, when the pair of electrodes has tapered angles, the coverage with the oxide semiconductor film and the first insulating film at the steps formed by the pair of electrodes is improved in some cases.

Note that it is preferable that at least one of the first insulating film and the third insulating film is an insulating film which releases oxygen by heat treatment.

When oxygen is supplied from the first insulating film or the third insulating film to the oxide semiconductor film, an interface state density between the oxide semiconductor film and the first insulating film or the third insulating film can be reduced. As a result, carrier trapping, occurring due to operation of the transistor or the like, at the interface between the oxide semiconductor film and the first insulating film or the third insulating film can be suppressed, and thus, a transistor with less deterioration in electric characteristics can be obtained.

Further, in some cases, charge is generated due to oxygen vacancy in the oxide semiconductor film. In general, part of oxygen vacancy in an oxide semiconductor film serves as a donor and causes release of an electron which is a carrier. As a result, the threshold voltage of the transistor shifts in the negative direction. By supplying sufficient oxygen to the oxide semiconductor film from the first insulating film or the third insulating film, oxygen vacancy in the oxide semiconductor film which causes the shift of the threshold voltage in the negative direction can be reduced.

In the case where an insulating film which releases oxygen by heat treatment is used as at least one of the first insulating film and the third insulating film, an insulating film which does not allow the released oxygen to pass therethrough (an insulating film having a small oxygen diffusion coefficient than the first insulating film or the third insulating film) is preferably used as the second insulating film. When the second insulating film has such a property, the amount of oxygen which is released from the first insulating film or the third insulating film and diffused to the outside of the semiconductor memory device can be reduced. Note that since a side surface of the insulating film which releases oxygen by heat treatment is surrounded by the netlike conductive film in one embodiment of the present invention, when oxygen does not penetrate the netlike conductive film, the second insulating film is not necessarily provided.

For the oxide semiconductor film, a material having a bandgap of 2.5 eV or more, preferably 3.0 eV or more may be selected. With use of a material with a bandgap in the above range, the off-state current of the transistor can be reduced. Note that in one embodiment of the present invention, in place of the oxide semiconductor, a material having semiconductor characteristics and a bandgap within the above range may be applied.

It is preferable that the oxide semiconductor film is highly purified so as to contain as little impurities (such as hydrogen, an alkali metal, an alkaline earth metal, a rare gas, nitrogen, phosphorus, or boron) generating carriers directly or indirectly as possible. Furthermore, it is preferable to reduce oxygen vacancy as much as possible. By reducing impurities and oxygen vacancy in the oxide semiconductor film, generation of carriers in the oxide semiconductor film is suppressed, and the off-state current of the transistor can be reduced.

As described above, when the off-state current of the third transistor is reduced, the charge accumulated in the capacitor can be retained for a long time, and a non-volatile semiconductor memory device can be obtained.

When the off-state current of the transistor which controls the potential of the capacitor is reduced, the charge accumulated in the capacitor can be retained for a long time, and a non-volatile semiconductor memory device can be provided.

In addition, the capacitor is provided along the side surface of the one of the pair of electrodes of the third transistor, whereby the capacitance of the capacitor can be increased without increase in the area occupied by the capacitor. As a result, a highly integrated semiconductor memory device can be provided.

In addition, the netlike conductive film can prevent the electrostatic breakdown of every memory cell, whereby a highly reliable semiconductor memory device can be provided with a high yield.

DETAILED DESCRIPTION OF THE INVENTION

Figure 1A:
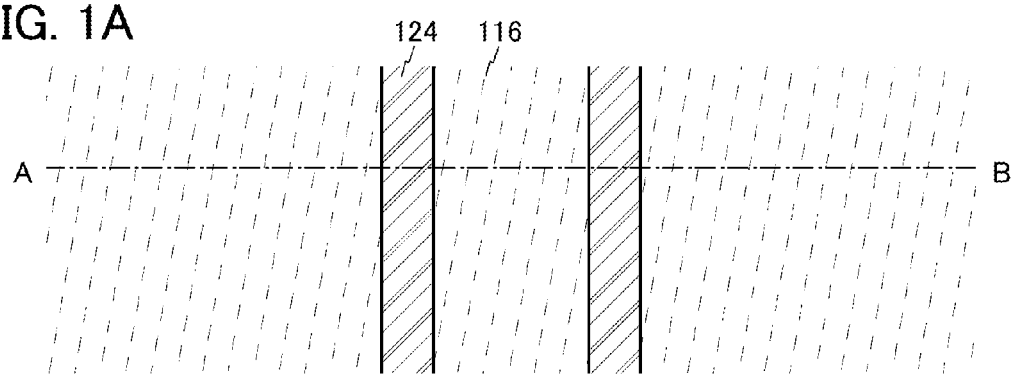
FIGS. 1A to 1D are top views and a cross-sectional view illustrating an example of a semiconductor memory device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

In addition, a voltage refers to a potential difference between a given potential and a reference potential (e.g., a ground potential) in many cases. Accordingly, a voltage can be replaced with a potential. Even when a potential is represented as, for example, a potential VH, a potential VDD, or a potential GND, the potential is not exactly equal to the potential VH, the potential VDD, or the potential GND in some cases. Therefore, the potential VH, the potential VDD, and the potential GND can be referred to as a potential close to the potential VH, a potential close to the potential VDD, and a potential close to the potential GND, respectively. Note that "to be grounded" has the same meaning as "to be connected to GND".

Even when it is written in this specification that "to be connected", there is the case where no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the present invention.

Note that in this specification, in referring to a specific row, a specific column, or a specific position in a matrix, a reference sign is accompanied by a sign denoting coordinates as follows, for example: "a memory cell MC_n_m", or "a bit line BL_m". In the case where a row, a column, or a position is not specified, the case where elements are collectively referred to, or the case where the position is obvious, the following expressions may be used: "a memory cell MC" and "a bit line BL", or simply "a memory cell" and "a bit line". (Embodiment 1)

In this embodiment, a semiconductor memory device to which one embodiment of the present invention is applied will be described.

Figure 1B:
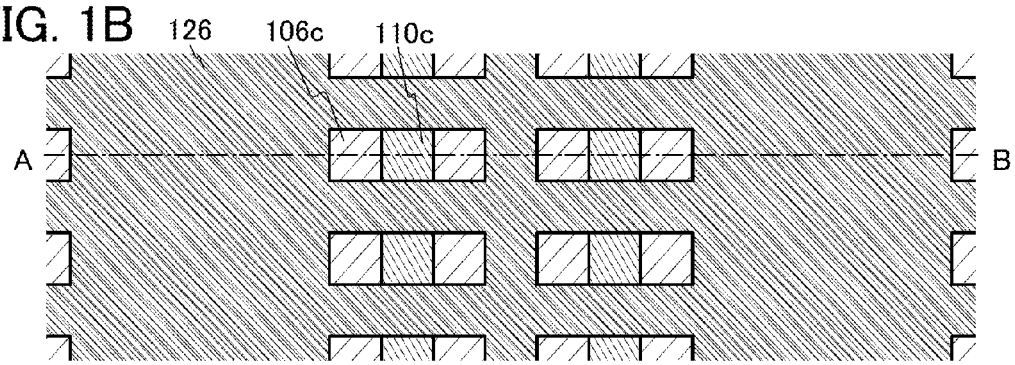
Figure 1C:
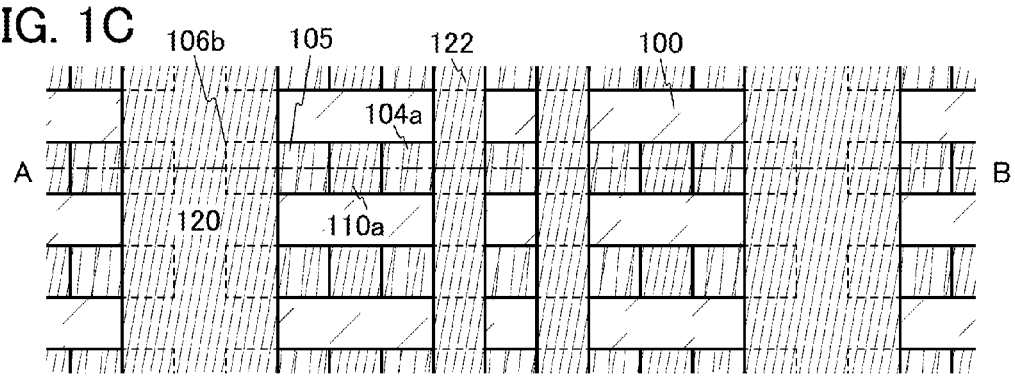
Figure 1D:
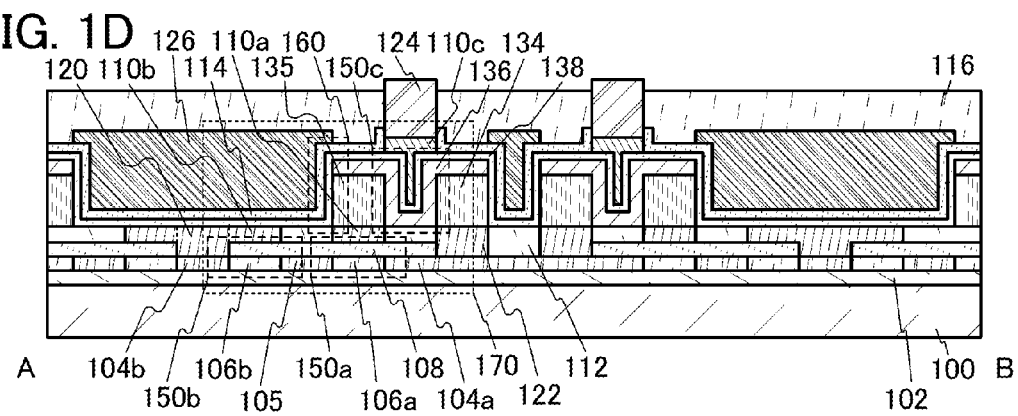

FIGS. 1A to 1C are top views illustrating parts of layers at respective levels of a memory cell array that is a semiconductor memory device. FIG. 1D illustrates a cross-section A-B corresponding to a dashed-dotted line A-B in FIGS. 1A to 1C. Note that FIG. 1A illustrates a layer at a level closer to a top surface, and FIG. 1C illustrates a layer at a level closer to a substrate 100. FIG. 1B illustrates a layer between the layers of FIGS. 1A and 1C. For simplification, some films (e.g., a first insulating film 102, a second insulating film 108, a third insulating film 112, a fourth insulating film 138, a fifth insulating film 114, and the like) are not illustrated in the top views.

The cross section A-B illustrated in FIG. 1D is described.

The memory cell array illustrated in FIG. 1D includes a memory cell 170 and a memory cell similar to the memory cell 170. The memory cell 170 includes the substrate 100; the first insulating film 102 which is provided over the substrate 100; a semiconductor film which is provided over the first insulating film 102 and includes a low-resistance region 104a, a low-resistance region 104b, a low-resistance region 105, a channel formation region 106a, and a channel formation region 106b; the second insulating film 108 which is provided over the semiconductor film and includes openings from which the low-resistance region 104a and the low-resistance region 104b are exposed; a gate electrode 110a, a gate electrode 110b, and the third insulating film 112 which are provided over the second insulating film 108; a bit line 122 which is formed in the same layer using the same material as those of the gate electrode 110a and the gate electrode 110b and is in contact with the low-resistance region 104a; a drain electrode 135 which is provided over the gate electrode 110a; a source electrode 134 which is provided over the bit line 122; an oxide semiconductor film 136 which is in contact with at least top surfaces of the source electrode 134 and the drain electrode 135; the fourth insulating film 138 which is provided to cover the gate electrode 110b, the source electrode 134, the drain electrode 135, and the oxide semiconductor film 136; a gate electrode 110c which overlaps with the oxide semiconductor film 136 with the fourth insulating film 138 provided therebetween; the fifth insulating film 114 which includes an opening from which the gate electrode 110c is exposed and is provided to cover the fourth insulating film 138; a netlike conductive film 126 which is provided over the fifth insulating film 114 and does not overlap with the gate electrode 110c; a sixth insulating film 116 which includes the opening from which the gate electrode 110c is exposed and is provided to cover the fifth insulating film 114 and the netlike conductive film 126; and a word line 124 which is in contact with the gate electrode 110c and provided over the sixth insulating film 116.

The memory cell 170 illustrated in FIG. 1D includes a source line 120, the bit line 122, the word line 124, a first transistor 150a, a second transistor 150b, a third transistor 150c, and a capacitor 160.

The low-resistance region 105 serves as a drain region of the first transistor 150a and a drain region of the second transistor 150b.

The channel formation region 106a and the channel formation region 106b serve as a channel of the first transistor 150a and a channel of the second transistor 150b, respectively.

The low-resistance region 104a and the low-resistance region 104b serve as a source region of the first transistor 150a and a source region of the second transistor 150b, respectively.

The bit line 122 is connected to the source region of the first transistor 150a and the source electrode 134 of the third transistor 150c.

The second insulating film 108 serves as a gate insulating film of the first transistor 150a and a gate insulating film of the second transistor 150b.

The source line 120 is connected to the gate electrode 110b and the source region (the low-resistance region 104b) in the second transistor 150b. Note that a dotted line between the source line 120 and the gate electrode 110b in the drawing is illustrated only for convenience, and the source line 120 and the gate electrode 110b may be formed using the same layer.

The fourth insulating film 138 serves as a gate insulating film of the third transistor 150c.

The fourth insulating film 138 and the fifth insulating film 114 serve as dielectric films of the capacitor 160.

The netlike conductive film 126 and the drain electrode 135 of the third transistor 150c serve as a pair of capacitor electrodes included in the capacitor 160. The netlike conductive film 126 is provided to have a net shape as illustrated in FIG. 1B. Therefore, since the netlike conductive film 126 faces three side surfaces of the drain electrode 135 of the third transistor 150c, the capacitance of the capacitor 160 can be larger than a capacitor in which a conductive film faces only one side surface. The area of the side surface of the drain electrode 135 can be increased by increasing the thickness of the drain electrode 135. Even when the drain electrode 135 has a large thickness, the area of the capacitor 160 is not changed. Therefore, the area occupied by the capacitor is not increased but the capacitance of the capacitor can be increased; thus, the integration degree of the memory cell array including a plurality of memory cells 170 in combination can be increased.

The gate electrode 110a of the first transistor 150a is connected to the drain electrode 135 of the third transistor 150c.

The netlike conductive film 126 functions as a common wiring and is connected to GND. In addition, the netlike conductive film 126 functions, owing to its shape, as a guard ring which prevents electrostatic breakdown of every memory cell.

Although each layer does not have a taper angle in FIG. 1D for simplification, one embodiment of the present invention is not limited thereto, and each layer may have a taper angle.

In this specification, the phrase "A is provided to cover B" means that A covers a side surface and a top surface of B. In addition, a case where C which is different from A and B is provided between A and B can also be represented as "A is provided to cover B". Note that C may be formed with a single layer or a stake of layers.

Further, in this specification, the phrase "B which is provided over A" means at least that B is provided to be partly in contact with a top surface of A. In a similar manner, the phrase "B which overlaps with A" means that B is provided to partly or entirely overlap with A in a top view.

Next, the circuit configuration of the memory cell array is described with reference to FIG. 2.

The memory cell array includes memory cells MC (each corresponding to the memory cell 170) arranged in a matrix, and operates when voltage is applied to a word line WL (corresponding to the word line 124), a bit line BL (corresponding to the bit line 122), and a source line SL (corresponding to the source line 120).

In the memory cell MC, the bit line BL, a source of the first transistor 150a, and a source of the third transistor 150c are connected to each other; the word line WL and a gate of the third transistor 150c are connected to each other; the source line SL, a gate of the second transistor 150b, and a source of the second transistor 150b are connected to each other; a drain of the first transistor 150a and a drain of the second transistor 150b are connected to each other; a gate of the first transistor 150a, a drain of the third transistor 150c, and one of the pair of capacitor electrodes of the capacitor 160 are connected to each other; and the other of the pair of capacitor electrodes included in the capacitor 160 and GND are connected to each other.

A memory cell MC_1_1 and a memory cell MC_2_1 share a bit line BL_1, and the memory cell MC_1_1 and a memory cell MC_1_2 share a word line WL_1 and a source line SL_1. In other words, the memory cells in the same column share one bit line BL, and the memory cells in the same row share one word line WL and one source line SL. In addition, a source of the second transistor 150b of the memory cell MC_1_1 and a source of the second transistor 150b of the memory cell MC_1_2 are connected to each other.

Figure 2:
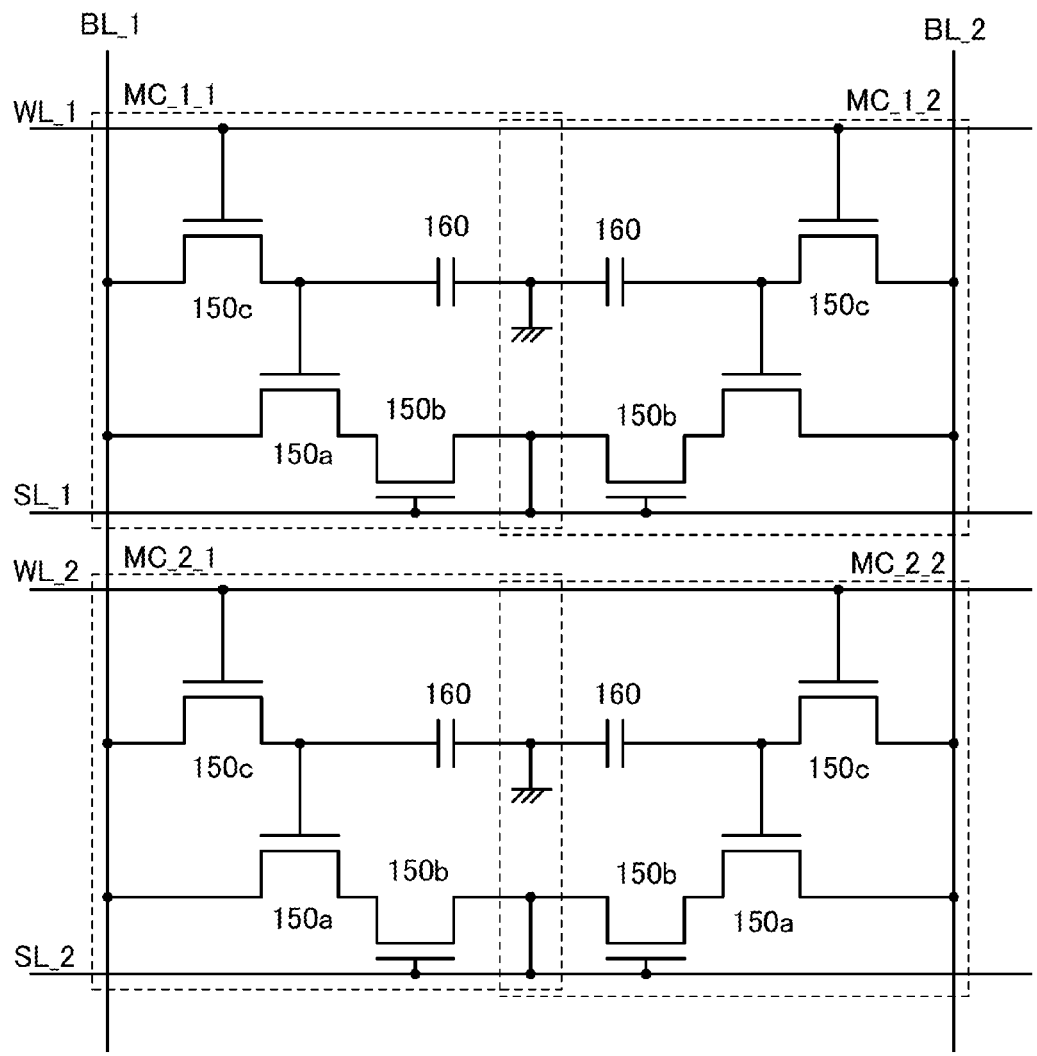
FIG. 2 is a circuit diagram illustrating an example of a semiconductor memory device according to one embodiment of the present invention.

Here, the memory cell 170 and the memory cell similar to the memory cell 170 illustrated in FIG. 1D correspond to, for example, the memory cell MC_1_1 and the memory cell MC_2_1 illustrated in FIG. 2.

Next, a method for writing data to the memory cell array is described.

Data is written row by row. Here, data writing begins at the memory cell MC_1_1 and the memory cell MC_1_2.

First, the word line WL_1 is set to a potential VH (a potential which is higher than VDD by the threshold voltage (Vth) of the third transistor 150c or more), and a word line WL_2, the source line SL_1, and a source line SL_2 are set to the potential GND. Then, the bit line BL corresponding to a column in which the memory cells MC in which Data 1 is to be written are provided is set to the potential VDD, and the bit line BL corresponding to a column in which the memory cells MC to which Data 0 is to be written are provided is set to the potential GND. In this manner, the potential of the capacitor 160 of the memory cell MC in which the Data 1 is to be written is set at VDD and the potential of the capacitor 160 of the memory cell MC in which the Data 0 is to be written is set at GND.

Next, in the next row, data is written in the memory cell MC_2_1 and a memory cell MC_2_2 by the same method as described above.

In this manner, data can be written in the memory cell array.

Next, a method for retaining data which has been written in the memory cell array is described.

In order to retain the written data, the word line WL_1, the word line WL_2, the bit line BL_1, a bit line BL_2, the source line SL_1, and the source line SL_2 are set to a floating potential (also referred to as a float). Alternatively, the word line WL_1, the word line WL_2, the bit line BL_1, the bit line BL_2, the source line SL_1, and the source line SL_2 are set to GND (or lower than GND).

In this manner, data which has been written in the memory cell array can be retained.

Next, a method for reading out the data retained in the memory cell array is described.

The retained data is read out row by row. Here, data is read out from the memory cell MC_1_1 and the memory cell MC_1_2.

First, the source line SL_1 is set to the potential VDD, and the source line SL_2, the word line WL_1, and the word line WL_2 are set to the potential GND. Thus, the second transistor 150b is turned on. Although not illustrated, the bit line BL_1 and the bit line BL_2 are connected to a pull-down circuit. In the case where the bit line BL is connected to the pull-down circuit, when no component is connected to the bit line BL, the bit line BL can be fixed at the potential GND. In other words, when the memory cell MC retains Data 1, the first transistor 150a is on and the bit line BL is set to the potential VDD. In addition, when the memory cell MC retains Data 0, the first transistor 150a is off, and thus the bit line BL is set to the potential GND. In this manner, data can be read out using the potential of the bit line BL.

Then, in the next row, data is read out from the memory cell MC_2_1 and the memory cell MC_2_2 in a similar manner.

In the above manner, data retained in the memory cell array can be read out.

The thickness of the oxide semiconductor film 136 is greater than or equal to 1 nm and less than or equal to 40 nm, preferably greater than or equal to 5 nm and less than or equal to 15 nm. In particular, in the case of a transistor whose channel length is less than or equal to 30 nm, when the thickness of the oxide semiconductor film 136 is set to approximately 5 nm, a short-channel effect can be suppressed and the transistor can have stable electric characteristics.

For example, for the oxide semiconductor film 136, an In—Sn—Ga—Zn—O-based material, an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, a Zn—Mg—O-based material, a Sn—Mg—O-based material, an In—Mg—O-based material, an In—Ga—O-based material, an In—O-based material, a Sn—O-based material, a Zn—O-based material, or the like may be used. Here, for example, an In—Ga—Zn—O-based material means an oxide containing indium (In), gallium (Ga), and zinc (Zn), and there is no particular limitation on the composition ratio. Further, the In—Ga—Zn—O-based material may contain an element other than In, Ga, and Zn.

In the case where an In—Zn—O-based oxide material is used for the oxide semiconductor film 136, any of the following is employed: In/Zn is 0.5 to 50 in an atomic ratio, preferably In/Zn is 1 to 20 in an atomic ratio, or further preferably In/Zn is 1.5 to 15 in an atomic ratio. When the atomic ratio of Zn is in the above range, the field-effect mobility of the transistor can be improved. Here, when the atomic ratio of the compound is In:Zn:O=X:Y:Z, the relation of Z>1.5X+Y is preferably satisfied.

Alternatively, a material represented by a chemical formula, $InMO_3(ZnO)_m$ (m>0) may be used for the oxide semiconductor film 136. Here, M represents one or more metal elements selected from Ga, Al, Fe, Mn, and Co. For example, M may be Ga, Ga and Al, Ga and Mn, Ga and Co, or the like.

As for the oxide semiconductor film 136, a material which has a bandgap of 2.5 eV or more, preferably has a bandgap of 3.0 eV or more, is selected in order to reduce the off-state current of the transistor. Note that a material having semiconductor characteristics whose band gap is within the above range which is not an oxide semiconductor may also be used.

The oxide semiconductor film 136 is an oxide semiconductor film in which hydrogen, an alkali metal, an alkaline earth metal, and the like are reduced and whose concentration of impurities is very low. Therefore, in the transistor whose channel region is formed using the oxide semiconductor film 136, off-state current can be reduced.

The hydrogen concentration in the oxide semiconductor film 136 is lower than $5\times10^{19}$ cm$^{-3}$, preferably lower than or equal to $5\times10^{18}$ cm$^{-3}$, more preferably lower than or equal to $1\times10^{18}$ cm$^{-3}$, still more preferably lower than or equal to $5\times10^{17}$ cm$^{-3}$.

Alkali metal is not an element included in an oxide semiconductor, and therefore, is an impurity. Also, alkaline earth metal is impurity in the case where alkaline earth metal is not included in an oxide semiconductor. An alkali metal, in particular, sodium (Na) diffuses in an insulating film to become Na$^+$. In addition, in the oxide semiconductor film, Na cuts or enters a bond between a metal and oxygen which are included in the oxide semiconductor. As a result, for example, deterioration of characteristics of the transistor, such as a normally-on state of the transistor due to shift of a threshold voltage in the negative direction, or a reduction in field-effect mobility, occurs; in addition, a variation in characteristics is also caused. Such deterioration of characteristics of the transistor and variation in characteristics due to the impurity frequently appear when the concentration of hydrogen in the oxide semiconductor film is sufficiently low. Therefore, when the hydrogen concentration in the oxide semiconductor film is lower than or equal to $1\times10^{18}$ cm$^{-3}$, preferably lower than or equal to $1\times10^{17}$ cm$^{-3}$, the concentration of the impurity is preferably reduced. Specifically, the measurement value of Na concentration is lower than or equal to $5\times10^{16}$ cm$^{-3}$, preferably lower than or equal to $1\times10^{16}$ cm$^{-3}$, more preferably lower than or equal to $1\times10^{15}$ cm$^{-3}$. In addition, the measurement value of lithium (Li) concentration is preferably lower than or equal to $5\times10^{15}$ cm$^{-3}$, more preferably lower than or equal to $1\times10^{15}$ cm$^{-3}$. In addition, the measurement value of potassium (K) concentration is lower than or equal to $5\times10^{15}$ cm$^{-3}$, preferably lower than or equal to $1\times10^{15}$ cm$^{-3}$.

By using the oxide semiconductor film 136 described above, the off-state current of the transistor can be reduced. For example, the off-state current of the transistor where the channel length is 3 μm and the channel width is 1 μm can be less than or equal to $1\times10^{-18}$ A, less than or equal to $1\times10^{-21}$ A, or less than or equal to $1\times10^{-24}$ A. Therefore, a semiconductor memory device with excellent data retention characteristics and low power consumption can be manufactured.

The oxide semiconductor film 136 is in a single crystal state, a polycrystalline (also referred to as polycrystal) state, an amorphous state, or the like.

The oxide semiconductor film 136 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a top surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a top surface side of the oxide semiconductor film, the proportion of crystal parts in the vicinity of the top surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). Note that when the CAAC-OS film is formed, the direction of c-axis of the crystal part is the direction parallel to a normal vector of the surface where the CAAC-OS film is formed or a normal vector of the top surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The CAAC-OS film is easily formed when a film serving as a base of the CAAC-OS film is flat. Specifically, the film serving as a base is formed to have an average surface roughness (Ra) of 1 nm or less, preferably 0.3 nm or less. Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by Formula 1.

[Formula 1]

$$Ra = \frac{1}{S_0} \int_{y1}^{y2} \int_{x1}^{x2} |f(x, y) - Z_0| \, dx \, dy \quad (1)$$

Note that, in Formula 1, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents average height of the measurement surface. Ra can be measured using an atomic force microscope (AFM).

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like; a compound semiconductor substrate made of silicon germanium or the like; a silicon-on-insulator (SOI) substrate; or the like may be used as the substrate 100. Still alternatively, any of these substrates further provided with a semiconductor element is preferably used as the substrate 100.

Further alternatively, a flexible substrate may be used as the substrate 100. In that case, a transistor is manufactured directly on the flexible substrate. As a method for forming a transistor on a flexible substrate, a method may be employed in which after the transistor is formed over a non-flexible substrate, the transistor is separated and transferred to the substrate 100 that is a flexible substrate. In that case, a separation layer is preferably provided between the non-flexible substrate and the transistor.

The first insulating film 102 may be formed with a single layer or a stack of layers using one or more kinds of materials selected from silicon oxide, silicon oxynitride, silicon nitride oxide, silicon nitride, aluminum oxide, aluminum nitride, hafnium oxide, zirconium oxide, yttrium oxide, lanthanum oxide, tantalum oxide, and magnesium oxide.

The semiconductor film including the low-resistance region 104a, the low-resistance region 104b, the low-resistance region 105, the channel formation region 106a, and the channel formation region 106b may be formed using an amorphous film, a microcrystalline film, a polycrystalline film, or a signal crystal film of silicon, germanium, gallium arsenic, silicon carbide, or gallium nitride. Alternatively, the semiconductor film can be formed using a method and a material that are similar to those of the oxide semiconductor film 136. Note that the low-resistance region 104a, the low-resistance region 104b, and the low-resistance region 105 may be provided in such a manner that an impurity which has an effect of reducing a resistance value is selectively added to part of the semiconductor film formed using any of the above materials.

The second insulating film 108 may be formed using a method and a material that are similar to those of the first insulating film 102.

The gate electrode 110a, the gate electrode 110b, the source line 120, and the bit line 122 are provided in the same layer using the same material, and, for example, may be formed with a signal layer or a stack of layers using one or more kinds of materials selected from Al, Ti, Cr, Co, Ni, Cu, Y, Zr, Mo, Ag, Ta, and W; a nitride thereof; an oxide thereof; and an alloy thereof.

The third insulating film 112 may be formed using a method and a material that are similar to those of the first insulating film 102. Note that it is preferable that the heights of top surfaces of the third insulating film 112, the gate electrode 110a, the gate electrode 110b, the source line 120, and the bit line 122 are almost aligned with each other because the third transistor 150c and the capacitor 160 formed later can be manufactured easily.

The source electrode 134 and the drain electrode 135 may be formed using a method and a material that are similar to those of the gate electrode 110a, the gate electrode 110b, the source line 120, and the bit line 122.

The capacitor 160 is provided along the three side surfaces of the drain electrode 135. Therefore, as the thickness of the drain electrode 135 becomes larger, the capacitance of the capacitor 160 is increased. However, when the thickness of the drain electrode 135 is too large, the coverage of a layer to be formed later might be reduced. Therefore, when the width of the drain electrode 135 is 1, the thickness of the drain electrode 135 is set to greater than or equal to 0.5 and less than or equal to 10, preferably greater than or equal to 1 and less than or equal to 4.

The fourth insulating film 138 may be formed using a method and a material that are similar to those of the first insulating film 102.

At least one of the third insulating film 112 and the fourth insulating film 138 is preferably formed using an insulating film which releases oxygen by heat treatment. The use of a film which releases oxygen by heat treatment makes it possible to repair defects generated in the oxide semiconductor film 136 and the vicinity of an interface between the film and the oxide semiconductor film 136; thus, deterioration in electric characteristics of the transistor can be suppressed.

To release oxygen by heat treatment means that the released amount of oxygen which is converted to oxygen atoms is greater than or equal to $1.0 \times 10^{18}$ cm$^{-3}$, in particular, greater than or equal to $3.0 \times 10^{20}$ cm$^{-3}$ in thermal desorption spectroscopy (TDS).

Here, a method to measure the amount of released oxygen using TDS analysis is described.

The total amount of the gas which is released at the time of TDS analysis is proportional to an integral value of the ion intensity of the released gas. Then, the integral value is compared with that of a reference sample, whereby the total amount of the gas which is released can be calculated.

For example, the number of released oxygen molecules ($N_{O2}$) from an insulating film can be found according to an Formula 2 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal

[Formula 2]

$$N_{O2} = N_{H2}/S_{H2} \times S_{O2} \times \alpha \qquad (2)$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of Formula 2. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry.

When oxygen is supplied from the third insulating film 112 and the fourth insulating film 138 to the oxide semiconductor film 136, the interface state density between the oxide semiconductor film 136 and the third insulating film 112 and the interface state density between the oxide semiconductor film 136 and the fourth insulating film 138 can be reduced. As a result, carrier trapping, occurring due to the operation of the transistor or the like, at the interface between the oxide semiconductor film 136 and the third insulating film 112 and the interface between the oxide semiconductor film 136 and the fourth insulating film 138 can be suppressed, and thus, a transistor with less deterioration in electric characteristics can be obtained.

Further, in some cases, charge is generated due to oxygen vacancy in the oxide semiconductor film 136. In general, part of oxygen vacancy in an oxide semiconductor film serves as a donor and causes release of an electron which is a carrier. As a result, the threshold voltage of a transistor shifts in the negative direction. By supplying sufficient oxygen to the oxide semiconductor film 136 from the third insulating film 112 and the fourth insulating film 138, the oxygen vacancy in the oxide semiconductor film which causes the shift of the threshold voltage in the negative direction can be reduced.

The gate electrode 110c may be formed using a method and a material that are similar to those of the gate electrode 110a, the gate electrode 110b, the source line 120, and the bit line 122.

As the fifth insulating film 114, a material which has smaller oxygen diffusion coefficient than the third insulating film 112 and the fourth insulating film 138 at temperatures higher than or equal to 250° C. and lower than or equal to 450° C. may be used. When oxygen is released from the third insulating film 112 and the fourth insulating film 138, such a structure makes it possible to reduce the amount of oxygen which is diffused to the outside of the third transistor 150c.

Note that a material of the fifth insulating film 114 can be selected appropriately from materials which are described as the materials of the third insulating film 112 and the fourth insulating film 138. However, a material which has smaller oxygen diffusion coefficient than the materials selected as the materials of the third insulating film 112 and the fourth insulating film 138 at temperatures higher than or equal to 250° C. and lower than or equal to 450° C. is used. For example, in the case where silicon oxide films are used as the third insulating film 112 and the fourth insulating film 138, an aluminum oxide film may be used as the fifth insulating film 114. Not only oxygen but also water does not easily penetrate an aluminum oxide film. Therefore, the entrance of water from the outside of the transistor 140 can be prevented, so that the reliability of the semiconductor memory device can be increased. The aluminum oxide film may be formed to a thickness greater than or equal to 5 nm and less than or equal to 200 nm, preferably greater than or equal to 20 nm and less than or equal to 100 nm.

The netlike conductive film 126 may be formed using a method and a material that are similar to those of the gate electrode 110a, the gate electrode 110b, the source line 120, and the bit line 122.

The sixth insulating film 116 may be formed using a method and a material that are similar to those of the first insulating film 102. The sixth insulating film 116 may be formed using a resin material, e.g., a polyimide film, an acrylic film, or an epoxy film and formed with a single layer or a stack of layers. The sixth insulating film 116 preferably has, but not limited thereto, a flat top surface. Projections and depressions due to the shape of a base may be formed in the top surface of the sixth insulating film 116.

The word line 124 may be formed using a method and a material that are similar to those of the gate electrode 110a, the gate electrode 110b, the source line 120, and the bit line 122. The word line 124 is connected to the gate electrode 110c through an opening provided in the sixth insulating film 116 and the fifth insulating film 114.

The capacitor 160 is formed along the side surface of the drain electrode 135 in the memory cell 170 described above and thus can have a large capacitance.

In addition, the netlike conductive film 126 is connected to GND, and, owing to its shape, the netlike conductive film 126 functions as a guard ring which prevents the electrostatic breakdown of every memory cell.

Next, a method for manufacturing the memory cell array illustrated in FIGS. 1A to 1D is described with reference to FIGS. 3A to 3F and FIGS. 4A to 4D.

Figure 3A:
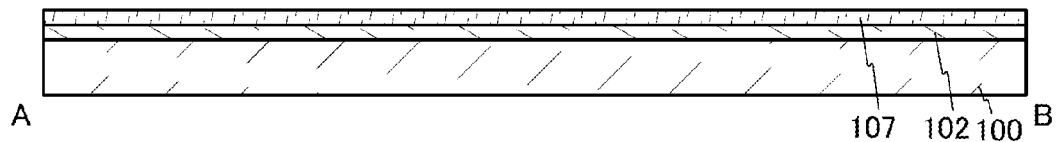
FIGS. 3A to 3F are cross-sectional views illustrating an example of a method for manufacturing a semiconductor memory device illustrated in FIGS. 1A to 1D.
Figure 3B:
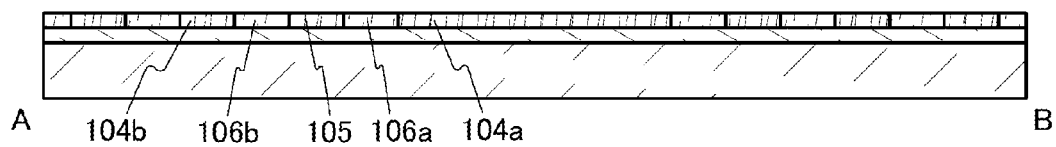
Figure 3C:
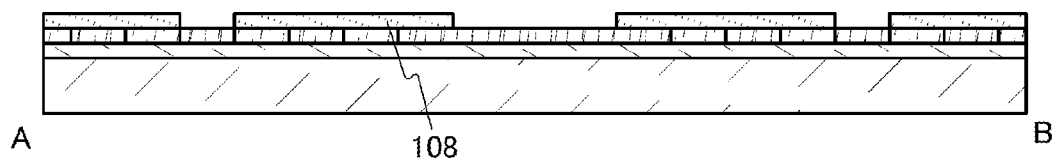
Figure 3D:
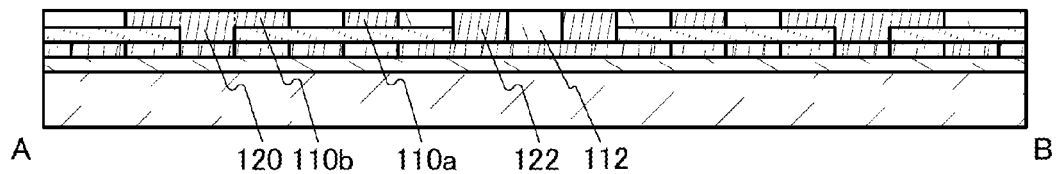

First, the first insulating film 102 and a semiconductor film 107 are formed in this order over the substrate 100 (see FIG. 3A). Note that a semiconductor element may be additionally provided over the substrate 100, and the first insulating film 102 may be formed when the semiconductor element is formed.

The first insulating film 102 may be deposited by a sputtering method, an evaporation method, a plasma chemical vapor deposition method (PCVD method), a pulsed laser deposition method (PLD method), an atomic layer deposition method (ALD method), a molecular beam epitaxy method (MBE method), or the like. Note that the first insulating film 102 may be formed by a thermal oxidation method depending on the material of the substrate 100.

The semiconductor film 107 may be deposited by a sputtering method, an evaporation method, a PCVD method, a PLD method, an ALD method, an MBE method, or the like. In the case where a semiconductor substrate, e.g., an SOI substrate is used as the substrate 100, a semiconductor film included in the semiconductor substrate may be used as the semiconductor film 107.

Next, a resist mask is formed over the semiconductor film 107 by a photolithography method, and an impurity having an effect of reducing the resistance value of the semiconductor film 107 is selectively added using the resist mask, so that the low-resistance region 104a, the low-resistance region 104b, and the low-resistance region 105 are formed. At the same time, the channel formation region 106a and the channel formation region 106b are formed (see FIG. 3B). As the impurity material having such an effect, phosphorus, boron, arsenic, and the like are given in the case where the semiconductor film 107 is a silicon film. Note that the addition of the impurity to the semiconductor film 107 is not necessarily performed after the formation of the semiconductor film 107. Alternatively, the impurity may be added in the following manner: after the formation of the second insulating film 108 which is described later, the impurity is added using the second insulating film 108 as a mask, and after the formation of the gate electrode 110a, the gate electrode 110b, the source line 120, and the bit line 122, the impurity is further added using the gate electrode 110a, the gate electrode 110b, the source line 120, and the bit line 122 as masks. The impurity is added to the semiconductor film 107 using the second insulating film 108 as a mask, and then the impurity is added to the semiconductor film 107 using the gate electrode 110a, the gate electrode 110b, the source line 120, and the bit line 122 as masks, whereby the photolithography step for adding the impurity can be omitted.

Next, the second insulating film 108 is deposited and a resist mask is formed over the insulating film by a photolithography method. Then, openings from which the low-resistance region 104a and the low-resistance region 104b are exposed are formed in the second insulating film 108 using the resist mask (see FIG. 3C).

Next, a conductive film is deposited using a sputtering method, an evaporation method, a PCVD method, a PLD method, an ALD method, an MBE method, or the like. Then, a resist mask is formed over the conductive film by a photolithography method, and the conductive film is processed using the resist mask, so that the gate electrode 110a, the gate electrode 110b, the source line 120, and the bit line 122 are formed.

Next, an insulating film is deposited. The insulating film is subjected to chemical mechanical polishing (CMP) treatment or etching treatment, so that the gate electrode 110a, the gate electrode 110b, the source line 120, and the bit line 122 are exposed and the third insulating film 112 is formed (see FIG. 3D). At this time, a top surface formed by these layers is preferably planarized.

Figure 3E:
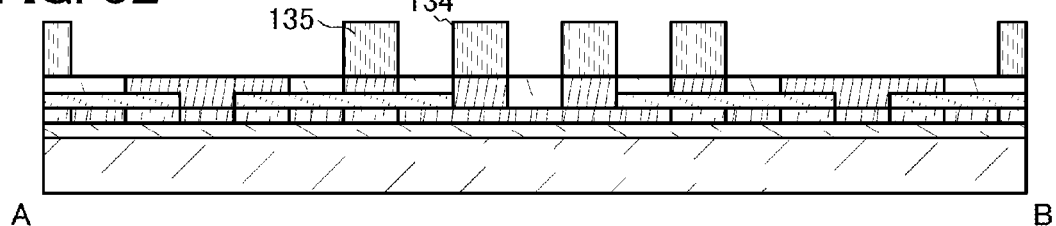
Figure 3F:
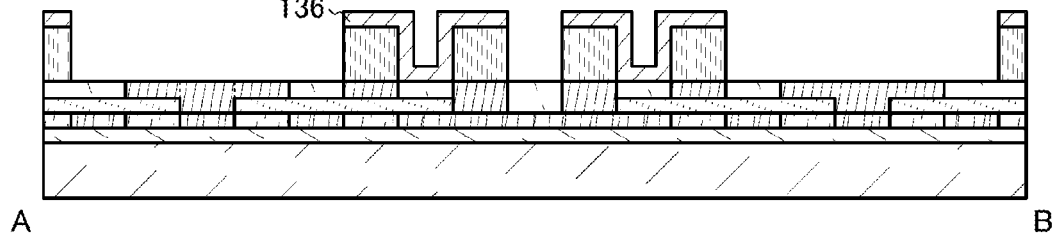

Next, a conductive film is deposited and is processed to form the source electrode 134 and the drain electrode 135 (see FIG. 3E).

Then, an oxide semiconductor film is deposited by a sputtering method, an evaporation method, a PCVD method, a PLD method, an ALD method, an MBE method, or the like. At this time, when the oxide semiconductor film is deposited while being subjected to heat treatment at a temperature higher than or equal to 250° C. and lower than or equal to 450° C., a CAAC-OS film is easily formed. Alternatively, after the oxide semiconductor film is deposited, heat treatment may be performed at a temperature higher than or equal to 450° C. and lower than the strain point of the substrate, preferably higher than or equal to 600° C. and lower than or equal to 700° C. Next, a resist mask is formed over the oxide semiconductor film by a photolithography method, and the oxide semiconductor film is processed using the resist mask, so that the oxide semiconductor film 136 is formed (see FIG. 3F).

In the case where the oxide semiconductor film is deposited by a sputtering method, a deposition chamber is preferably evacuated using a rough vacuum pump such as a dry pump and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective.

An adsorbate inside the deposition chamber in which the oxide semiconductor film is deposited does not affect the pressure in the deposition chamber because it is adsorbed, but leads to release of gas at the time of the evacuation of the deposition chamber. Therefore, it is important that the adsorbate inside the deposition chamber is desorbed as much as possible and evacuation is performed in advance with the use of a pump having high evacuation capability. Note that the deposition chamber may be subjected to baking for promotion of desorption of the adsorbate. By the baking, the rate of desorption of the adsorbate can be increased about tenfold. The baking may be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased. Note that the rate of desorption of the adsorbate can be further increased by heating of the inert gas to be introduced at substantially the same temperature as the temperature of the baking. In addition, the rate of desorption of the adsorbate can be further increased also by dummy deposition performed at the same time as the baking. Here, the dummy deposition refers to deposition on a dummy substrate by sputtering, in which a film is deposited on the dummy substrate and the inner wall of a deposition chamber so that impurities in the deposition chamber and an adsorbate on the inner wall of the deposition chamber are confined in the film. For the dummy substrate, a material from which a small amount of gas is released is preferably used, and for example, the same material as that of the substrate 100 may be used.

In addition, when a deposition gas whose dew point is lower than or equal to −95° C., preferably lower than or equal to −110° C. is used, the hydrogen concentration in the oxide semiconductor film can be reduced.

When the oxide semiconductor film is deposited in this manner, the entrance of hydrogen into the oxide semiconductor film can be suppressed. In addition, when a film in contact with the oxide semiconductor film is deposited using the same deposition chamber, the entrance of hydrogen from the film in contact with the oxide semiconductor film into the oxide semiconductor film can be suppressed. Consequently, a transistor with high reliability and less variation in electrical characteristics can be manufactured.

Figure 4A:
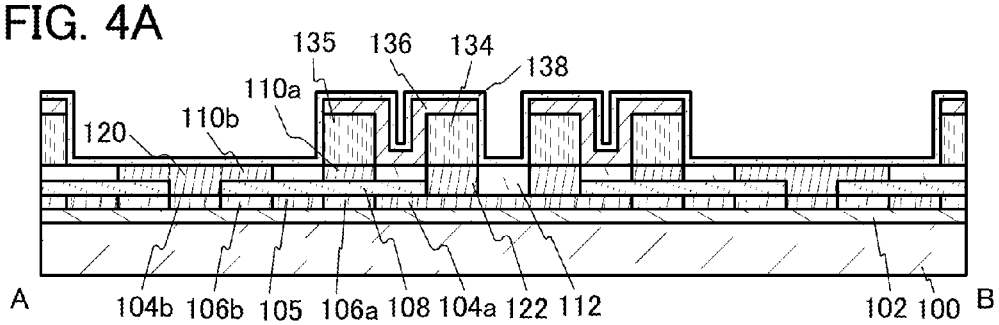
FIGS. 4A to 4D are cross-sectional views illustrating an example of a method for manufacturing a semiconductor memory device illustrated in FIGS. 1A to 1D.

Next, the fourth insulating film 138 is deposited (see FIG. 4A).

Figure 4B:
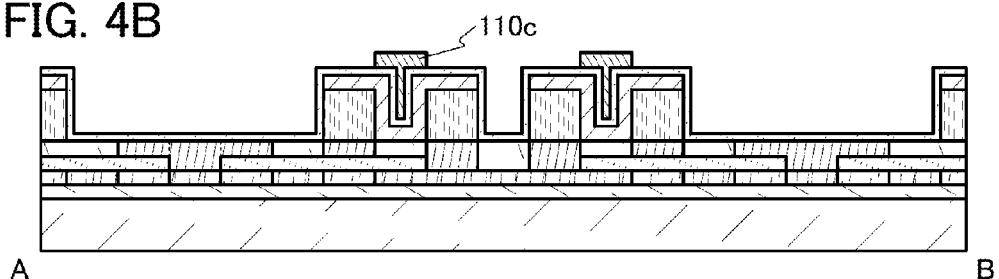

Next, a conductive film is deposited and processed to form the gate electrode 110c (see FIG. 4B).

Figure 4C:
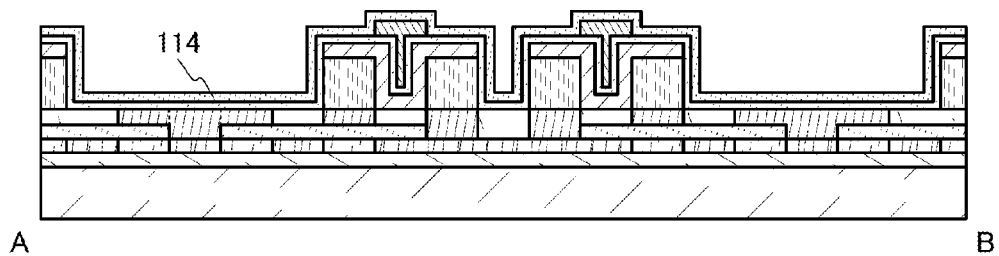

Then, the fifth insulating film 114 is deposited (see FIG. 4C).

Figure 4D:
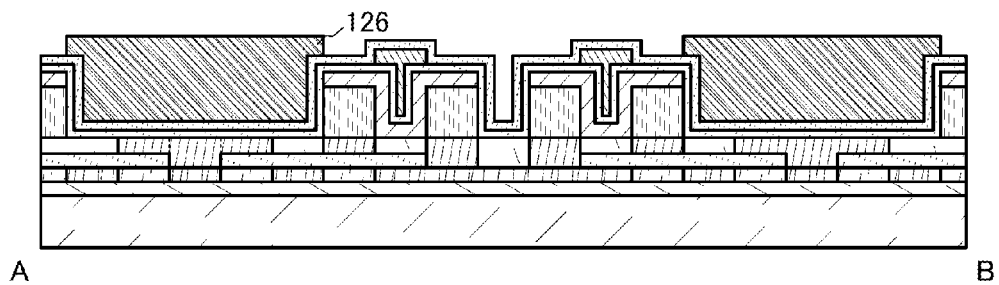

Next, a conductive film is deposited and processed to form the netlike conductive film 126 (see FIG. 4D).

Next, the sixth insulating film 116 is deposited and an opening from which the gate electrode 110c is exposed is formed in the sixth insulating film 116 and the fifth insulating film 114. Then, the word line 124 connected to the gate electrode 110c through the opening provided in the sixth insulating film 116 is formed over the sixth insulating film 116. Through the above steps, the memory cell array illustrated in FIGS. 1A to 1D can be manufactured.

Note that heat treatment is preferably performed with at least any of the following timings: after the deposition of the oxide semiconductor film; after the formation of the fourth insulating film 138; after the deposition of the fifth insulating film 114. By the heat treatment, oxygen is released from the third insulating film 112 or the fourth insulating film 138, and oxygen vacancy in the oxide semiconductor film (or the oxide semiconductor film 136) or in the vicinity of the interface of the oxide semiconductor film (or the oxide semiconductor film 136) can be reduced. The heat treatment may be performed at a temperature higher than or equal to 250° C. and lower than or equal to 450° C. Note that heat treatment similar thereto may be performed after the memory cell array is manufactured.

Note that plasma treatment such as reverse sputtering treatment may be performed on the source electrode 134 and the drain electrode 135. When such treatment is performed, a top edge portion of the source electrode 134 and a top edge portion of the drain electrode 135 each can have a curved shape, and coverage with the oxide semiconductor film 136, the third insulating film 112, the gate electrode 110c, and the netlike conductive film 126 which are formed later can be improved.

The memory cell 170 forming the memory cell array manufactured as described above can retain written data for a long time owing to the third transistor 150c with small off-state current and the capacitor 160 having a small area and a large capacitance. In addition, since the data is retained even when supply of power is stopped, power consumption can be reduced.

In addition, when the capacitor 160 is provided along the three side surfaces of the drain electrode 135 of the third transistor 150c, the capacitance of the capacitor can be increased without increase in the area occupied by the capacitor, so that a highly integrated semiconductor memory device can be provided.

In addition, when the netlike conductive film 126 is provided, the electrostatic breakdown of every memory cell can be prevented and the yield and the reliability of the semiconductor memory device can be improved.

This embodiment can be implemented in appropriate combination with any of the other embodiments.

(Embodiment 2)

In this embodiment, a memory cell array including memory cells, which has a different structure from that described in Embodiment 1 will be described with reference to FIGS. 5A and 5B.

Figure 5A:
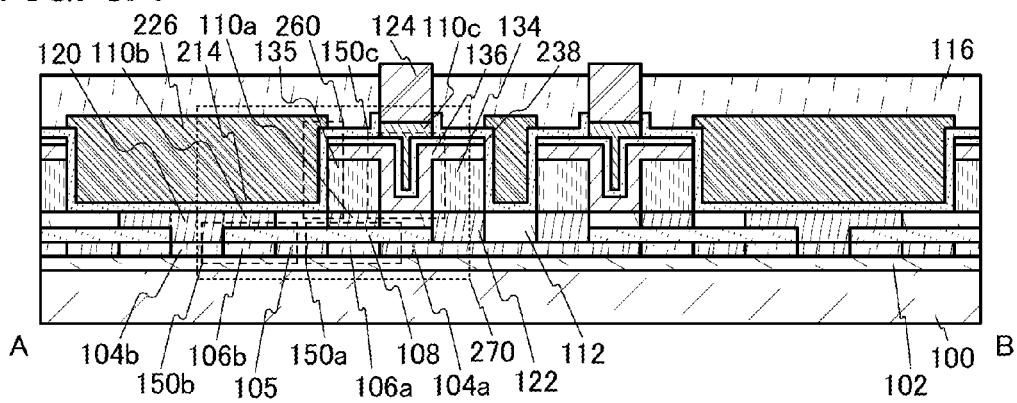
FIGS. 5A and 5B are cross-sectional views each illustrating an example of a semiconductor memory device according to one embodiment of the present invention, which is different from the semiconductor memory device in FIGS. 1A to 1D.

A memory cell 270 illustrated in FIG. 5A is different from the memory cell 170 in that a fourth insulating film 238 is provided only over an oxide semiconductor film 136. That is, the shape of a top surface of the fourth insulating film 238 substantially corresponds to the shape of a top surface of the oxide semiconductor film 136.

Since the fourth insulating film 238 is provided over only the oxide semiconductor film 136, a capacitor 260 has a different shape from the capacitor 160. Specifically, a netlike conductive film 226, the fourth insulating film 238, and a fifth insulating film 214 are provided without the netlike conductive film 126, the fourth insulating film 138, and the fifth insulating film 114.

Since the fourth insulating film 238 is provided over only the oxide semiconductor film 136, only the fifth insulating film 214 serves as a dielectric film of the capacitor 260. Therefore, the capacitance of the capacitor 260 can be larger than that of the capacitor 160. As a result, the memory cell 270 can retain written data for a long time as compared to the memory cell 170.

The netlike conductive film 226, the fourth insulating film 238, and the fifth insulating film 214 may be formed using methods and materials that are similar to those of the netlike conductive film 126, those of the fourth insulating film 138, and those of the fifth insulating film 114, respectively.

Note that first transistor 150a, the second transistor 150b, and the third transistor 150c have the same structures as those described in the Embodiment 1.

Figure 5B:
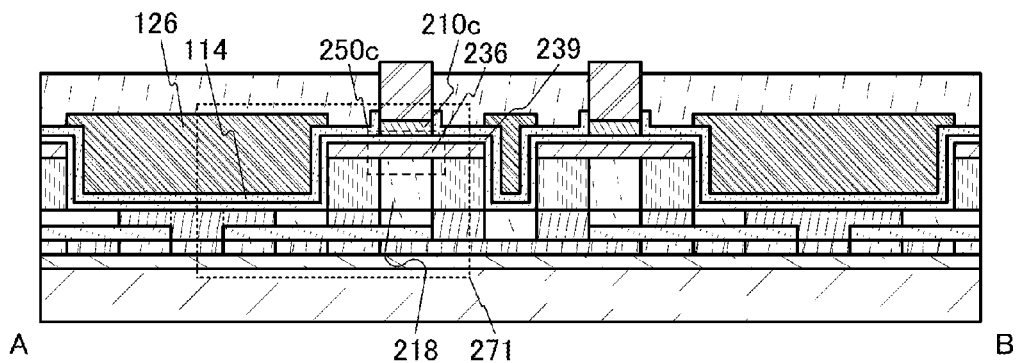

A memory cell 271 illustrated in FIG. 5B is different from the memory cell 170 in that a seventh insulating film 218 which fills a space between the source electrode 134 and the drain electrode 135 is included.

When the seventh insulating film 218 is provided, a third transistor 250c has a different shape from the third transistor 150c. Specifically, an oxide semiconductor film 236, a fourth insulating film 239, and a gate electrode 210c are provided without the oxide semiconductor film 136, the fourth insulating film 138, and the gate electrode 110c. Here, the seventh insulating film 218 allows the structure in which the oxide semiconductor film 236, and the fourth insulating film 238, and the gate electrode 210c are not formed on steps formed by the source electrode 134 and the drain electrode 135. Therefore, a structure which prevents leakage current and disconnection due to the steps can be obtained. As a result, the yield of a semiconductor memory device can be improved.

The seventh insulating film 218 may be formed using a method and a material that are similar to those of the first insulating film 102. In addition, when an insulating film which releases oxygen by heat treatment is used as the seventh insulating film 218, the third transistor 250c with less deterioration in electric characteristics can be obtained.

The oxide semiconductor film 236 may be formed using a method and a material that are similar to those of the oxide semiconductor film 136, and the gate electrode 210c may be formed using a method and a material that are similar to those of gate electrode 110c.

Note that first transistor 150a, the second transistor 150b, and the capacitor 160 have the same structures as those described in the Embodiment 1.

Note that in FIG. 5B, the fourth insulating film 239 may be provided over only the oxide semiconductor film 236.

According to this embodiment, a semiconductor memory device which can retain data for a long time as compared to that in Embodiment 1 can be obtained with a high yield.

This embodiment can be implemented in appropriate combination with any of the other embodiments.

(Embodiment 3)

A central processing unit (CPU) can be formed using the semiconductor memory device described in Embodiment 1 or Embodiment 2 for at least part of the CPU.

Figure 6A:
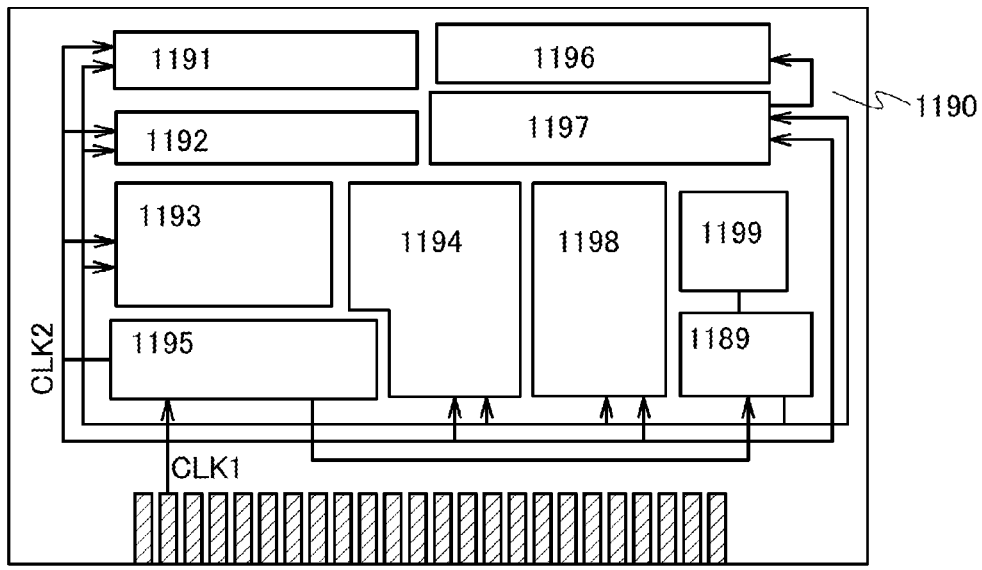
FIG. 6A is a block diagram illustrating a specific example of a CPU according to one embodiment of the present invention and FIGS. 6B and 6C are each a circuit diagram illustrating part of the CPU.

FIG. 6A is a block diagram illustrating a specific structure of a CPU. The CPU illustrated in FIG. 6A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 6A is only an example in which the structure is simplified, and a variety of structures is applied to an actual CPU depending on the application.

An instruction that is input to the CPU via the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 6A, a semiconductor memory device is provided in the register 1196. As the semiconductor memory device in the register 1196, for example, the semiconductor memory device described in Embodiment 1 or Embodiment 2 can be used.

In the CPU illustrated in FIG. 6A, the register controller 1197 selects operation of retaining data in the register 1196 in accordance with an instruction from the ALU 1191. That is, the register controller 1197 determines whether data is retained by a phase-inversion element or by a capacitor in the semiconductor memory device included in the register 1196. When data retention by the phase-inversion element is selected, power supply voltage is supplied to the semiconductor memory device in the register 1196. When data retention by the capacitor is selected, the data is rewritten in the capacitor, and supply of power supply voltage to the semiconductor memory device in the register 1196 can be stopped.

Figure 6B:
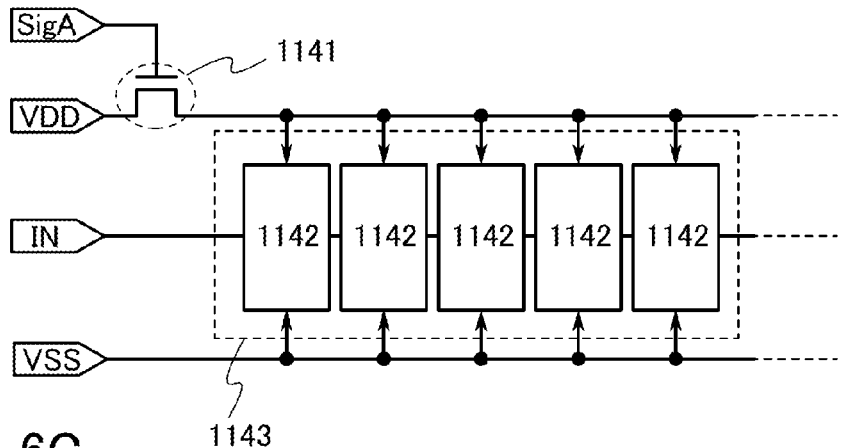
Figure 6C:
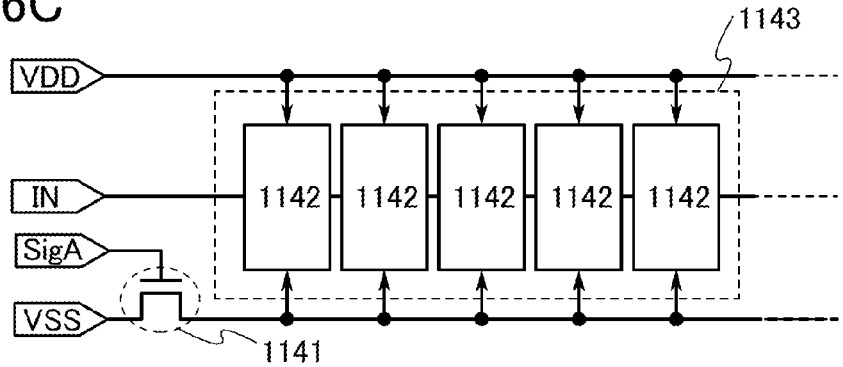

The power supply can be stopped by a switching element provided between a semiconductor memory device group and a node to which a power supply potential VDD or a power supply potential VSS is supplied, as illustrated in FIG. 6B or FIG. 6C. Circuits illustrated in FIGS. 6B and 6C are described below.

FIGS. 6B and 6C each illustrate an example of a structure of a memory circuit in which a transistor whose active layer is formed using an oxide semiconductor is used as a switching element for controlling supply of a power supply potential to a semiconductor memory device.

The memory device illustrated in FIG. 6B includes a switching element 1141 and a semiconductor memory device group 1143 including a plurality of semiconductor memory devices 1142. Specifically, as each of the semiconductor memory devices 1142, the semiconductor memory device described in Embodiment 1 or Embodiment 2can be used. Each of the semiconductor memory devices 1142 included in the semiconductor memory device group 1143 is supplied with the high-level power supply potential VDD via the switching element 1141. Further, each of the semiconductor memory devices 1142 included in the semiconductor memory device group 1143 is supplied with a potential of a signal IN and the low-level power supply potential VSS.

In FIG. 6B, a transistor whose active layer includes a semiconductor with a wide bandgap, such as an oxide semiconductor, is used as the switching element 1141, and the switching of the transistor is controlled by a signal SigA supplied to a gate thereof. Note that the third transistor 150c or the third transistor 250c may be used as the switching element 1141.

Note that FIG. 6B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

FIG. 6C illustrates an example of a memory device in which each of the semiconductor memory devices 1142 included in the semiconductor memory device group 1143 is supplied with the low-level power supply potential VSS via the switching element 1141. The supply of the low-level power supply potential VSS to each of the semiconductor memory devices 1142 included in the semiconductor memory device group 1143 can be controlled by the switching element 1141.

When a switching element is provided between a semiconductor memory device group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the consumed power can be reduced.

Although the CPU is given as an example here, the semiconductor memory device can also be applied to an LSI such as a digital signal processor (DSP), a custom LSI, or a field programmable gate array (FPGA).

This embodiment can be implemented in appropriate combination with any of the other embodiments
(Embodiment 4)

In this embodiment, examples of electronic devices to which any of Embodiments 1 to 3 is applied will be described.

Figure 7A:
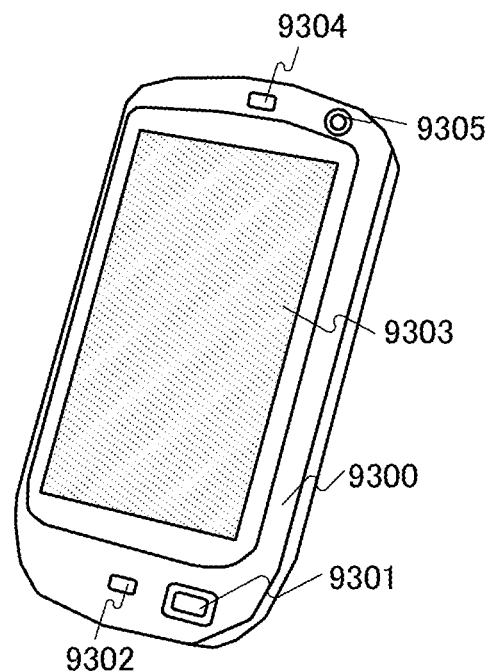
FIGS. 7A and 7B are perspective views each illustrating an example of an electronic device according to one embodiment of the present invention.

FIG. 7A illustrates a portable information terminal The portable information terminal includes a housing 9300, a button 9301, a microphone 9302, a display portion 9303, a speaker 9304, and a camera 9305, and has a function as a mobile phone. One embodiment of the present invention can be applied to a CPU and a memory module inside the electronic device.

Figure 7B:
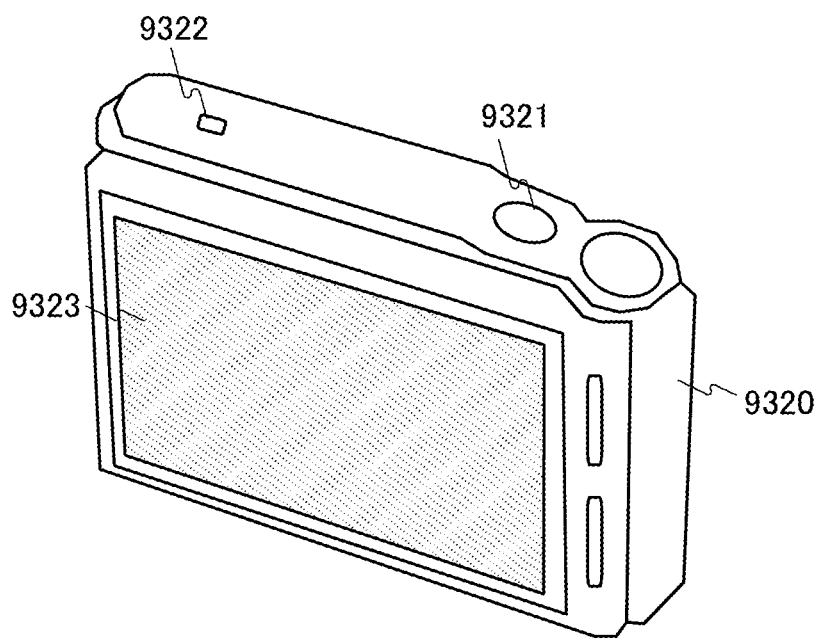

FIG. 7B illustrates a digital still camera. The digital still camera includes a housing 9320, a button 9321, a microphone 9322, and a display portion 9323. One embodiment of the present invention can be applied to a memory module inside the electronic device.

By applying one embodiment of the present invention, the quality of an electric device can be improved. In addition, power consumption can be reduced, and reliability can be improved.

This embodiment can be implemented in appropriate combination with any of the other embodiments.

This application is based on Japanese Patent Application serial No. 2011-091530 filed with Japan Patent Office on Apr. 15, 2011, the entire contents of which are hereby incorporated by reference.

What is claimed is:

1. A semiconductor memory device comprising:
    a first transistor;
    a second transistor;
    a third transistor comprising an oxide semiconductor film; and
    a capacitor comprising:
        a conductive film facing side surfaces of one of a source electrode and a drain electrode of the third transistor; and
        a first insulating film between the conductive film and the one of the source electrode and the drain electrode of the third transistor,
    wherein one of a source and a drain of the first transistor is electrically connected to one of a source and a drain of the second transistor, and
    wherein the one of the source electrode and the drain electrode of the third transistor is electrically connected to a gate electrode of the first transistor.

2. The semiconductor memory device according to claim 1, wherein the oxide semiconductor film is in contact with at least a top surface of the source electrode of the third transistor and a top surface of the drain electrode of the third transistor,
    wherein the third transistor further comprises a gate insulating film over the oxide semiconductor film, and
    wherein the first insulating film is formed over the gate insulating film.

3. The semiconductor memory device according to claim 1, wherein the conductive film and one of the source electrode and the drain electrode of the third transistor are configured to serve as a pair of capacitor electrodes, and
    wherein at least the first insulating film is configured to serve as a dielectric film of the capacitor.

4. The semiconductor memory device according to claim 1, wherein the third transistor further comprises a second insulating film between the source electrode of the third transistor and the drain electrode of the third transistor.

5. The semiconductor memory device according to claim 1, wherein the semiconductor memory device further comprises:
    a bit line;
    a word line; and
    a source line,
    wherein the other of the source and the drain of the first transistor is electrically connected to the bit line,
    wherein a gate electrode of the third transistor is electrically connected to the word line, and
    wherein a gate electrode of the second transistor and the other of the source and the drain of the second transistor are electrically connected to the source line.

6. The semiconductor memory device according to claim 1, wherein a thickness of the drain electrode of the third transistor is set to 1 to 4 times of a width of the drain electrode of the third transistor.

7. The semiconductor memory device according to claim 1, wherein the conductive film is grounded.

8. The semiconductor memory device according to claim 2, wherein the gate insulating film is configured to release oxygen by heat treatment.

9. The semiconductor memory device according to claim 2, wherein an oxygen diffusion coefficient of the first insulating film is smaller than an oxygen diffusion coefficient of the gate insulating film at temperatures higher than or equal to 250° C. and lower than or equal to 450° C.

10. The semiconductor memory device according to claim 2,
    wherein the first insulating film is an aluminum oxide film, and
    wherein the gate insulating film is a silicon oxide film or a silicon oxynitride film.

11. A semiconductor memory device comprising:
    a first transistor;
    a second transistor;
    a third transistor comprising an oxide semiconductor film; and
    a capacitor comprising:
        a conductive film; and
        a first insulating film between the conductive film and at least one of a source electrode and a drain electrode of the third transistor,
    wherein one of a source and a drain of the first transistor is electrically connected to one of a source and a drain of the second transistor,
    wherein one of the source electrode and the drain electrode of the third transistor is electrically connected to a gate electrode of the first transistor,
    wherein the conductive film has a net shape when seen from the above, and
    wherein the third transistor is provided in a mesh formed by the conductive film.

12. The semiconductor memory device according to claim 11,
    wherein the oxide semiconductor film is in contact with at least a top surface of the source electrode of the third transistor and a top surface of the drain electrode of the third transistor,
    wherein the third transistor further comprises a gate insulating film over the oxide semiconductor film, and wherein the first insulating film is formed over the gate insulating film.

13. The semiconductor memory device according to claim 11,
wherein the conductive film and one of the source electrode and the drain electrode of the third transistor are configured to serve as a pair of capacitor electrodes, and
wherein at least the first insulating film is configured to serve as a dielectric film of the capacitor.

14. The semiconductor memory device according to claim 11, wherein the third transistor further comprises a second insulating film between the source electrode of the third transistor and the drain electrode of the third transistor.

15. The semiconductor memory device according to claim 11, wherein the semiconductor memory device further comprises:
a bit line;
a word line; and
a source line,
wherein the other of the source and the drain of the first transistor is electrically connected to the bit line,
wherein a gate electrode of the third transistor is electrically connected to the word line, and
wherein a gate electrode of the second transistor and the other of the source and the drain of the second transistor are electrically connected to the source line.

16. The semiconductor memory device according to claim 11, wherein a thickness of the drain electrode of the third transistor is set to 1 to 4 times of a width of the drain electrode of the third transistor.

17. The semiconductor memory device according to claim 11, wherein the conductive film is grounded.

18. The semiconductor memory device according to claim 12, wherein the gate insulating film is configured to release oxygen by heat treatment.

19. The semiconductor memory device according to claim 12, wherein an oxygen diffusion coefficient of the first insulating film is smaller than an oxygen diffusion coefficient of the gate insulating film at temperatures higher than or equal to 250° C. and lower than or equal to 450° C.

20. The semiconductor memory device according to claim 12,
wherein the first insulating film is an aluminum oxide film, and
wherein the gate insulating film is a silicon oxide film or a silicon oxynitride film.

21. The semiconductor memory device according to claim 1, wherein the conductive film faces three side surfaces of the one of the source electrode and the drain electrode of the third transistor.

* * * * *

UNITED STATES PATENT AND TRADEMARK OFFICE
CERTIFICATE OF CORRECTION

PATENT NO. : 8,779,488 B2
APPLICATION NO. : 13/443027
DATED : July 15, 2014
INVENTOR(S) : Toshihiko Saito It is certified that error appears in the above-identified patent and that said Letters Patent is hereby corrected as shown below:

In the Specification

Column 6, line 52 – replace "110$c$is" with --110c is--;

Column 11, line 37 – replace "$R_a$is" with --$R_a$ is--;

Column 13, line 34 – after "minimal" insert --.--;

Column 17, line 39 – replace "110cthrough" with --110c through--; and

Column 20, line 31 – replace "2can" with --2 can--.

Signed and Sealed this
Second Day of June, 2015

Michelle K. Lee
*Director of the United States Patent and Trademark Office*